United States Patent
Zhang et al.

(10) Patent No.: US 11,264,956 B2
(45) Date of Patent: Mar. 1, 2022

(54) DC OFFSET CANCELLATION CIRCUIT AND DC OFFSET CANCELLATION METHOD

(71) Applicant: XIAMEN UX HIGH-SPEED IC CO., LTD., Fujian (CN)

(72) Inventors: Kexun Zhang, Xiamen (CN); Junhua Ge, Xiamen (CN); Jie Zhou, Xiamen (CN); Jianhua Pan, Xiamen (CN)

(73) Assignee: XIAMEN UX HIGH-SPEED IC CO., LTD., Fujian (CN)

( * ) Notice: Subject to any disclaimer, the term of this patent is extended or adjusted under 35 U.S.C. 154(b) by 0 days.

(21) Appl. No.: 16/969,988

(22) PCT Filed: Mar. 7, 2018

(86) PCT No.: PCT/CN2018/078202
§ 371 (c)(1),
(2) Date: Aug. 14, 2020

(87) PCT Pub. No.: WO2019/169565
PCT Pub. Date: Sep. 12, 2019

(65) Prior Publication Data
US 2020/0403583 A1    Dec. 24, 2020

(51) Int. Cl.
*H03F 3/16* (2006.01)
*H03F 3/45* (2006.01)
*H03F 1/02* (2006.01)
*H03K 5/24* (2006.01)

(52) U.S. Cl.
CPC .......... *H03F 3/16* (2013.01); *H03F 2200/171* (2013.01); *H03F 2200/375* (2013.01); *H03K 5/24* (2013.01)

(58) Field of Classification Search
CPC ................. H03F 3/16; H03F 2200/171; H03F 2200/375; H03F 3/45748; H03F 3/45973; H03F 3/45183; H03F 2200/321; H03F 2200/408; H03F 3/45475; H03K 5/24; H04B 10/69
USPC .............................................. 330/252–261, 9
See application file for complete search history.

(56) References Cited

U.S. PATENT DOCUMENTS

| | | | |
|---|---|---|---|
| 7,268,624 B2 * | 9/2007 | Chen | H03F 3/45197 330/2 |
| 8,829,989 B2 * | 9/2014 | Guo | H03F 3/45475 330/9 |

* cited by examiner

Primary Examiner — Hieu P Nguyen
(74) Attorney, Agent, or Firm — Leong C. Lei

(57) ABSTRACT

A DC offset cancellation circuit and a DC offset cancellation method are disclosed. The DC offset cancellation circuit comprises a high-speed amplifier, a voltage comparator, a microprocessor, and a digital-to-analog converter. The high-speed amplifier comprises an input stage with a DC offset cancellation function, an amplification stage, and an output buffer stage. The voltage comparator is connected to the output buffer stage. The microprocessor is connected to the voltage comparator. The digital-to-analog converter is connected to the microprocessor. The digital-to-analog converter is connected to the input stage.

5 Claims, 6 Drawing Sheets

DC OFFSET CANCELLATION CIRCUIT AND DC OFFSET CANCELLATION METHOD

BACKGROUND OF THE INVENTION

1. Field of the Invention

The present invention relates to electronic circuits, and more particularly to a DC offset cancellation circuit and a DC offset cancellation method.

2. Description of the Prior Art

Nowadays, optical communication has become the mainstream of the development of the communication industry. As an important part of the optical receiver, the high-speed signal amplifier is configured to amplify the voltage signal provided by the preceding transimpedance amplifier for use in the subsequent circuit. In general, a conventional high-speed signal amplifier is a combination of a limiting amplifier and a differential amplifier. In high-speed signal amplifiers, a DC offset cancellation circuit is required to cancel the output DC level offset caused by process distortion or input DC level offset. Otherwise, the output DC level offset will affect the normal operation of the amplifier and eventually cause the circuit imbalance.

FIG. 1 is a schematic diagram of the structure of a conventional DC offset cancellation circuit, which includes a high-speed amplifier, two low-pass filters, and a differential amplifier.

The high-speed amplifier includes an input stage with a DC offset cancellation function, an amplification stage, and an output buffer stage. The input stage has a first signal input terminal Inp, a second signal input terminal Inn, a first signal output terminal Outp, a second signal output terminal Outn, a first DC compensation terminal DCinp, and a second DC compensation terminal DCinn. The first signal input terminal Inp and the second signal input terminal Inn are configured to input input signals inp and inn, respectively. The DC compensation terminals DCinp and DCinn are configured to input compensation signals dcinp and dcinn, respectively. The first signal output terminal Outp and the second signal output terminal Outn are configured to output first output signals outp1 and outn1, respectively. The first output signals outp1 and outn1 are generated by the input stage after processing the input signals inp and inn and the compensation signals dcinp and dcinn. A non-inverting input terminal and an inverting input terminal of the amplification stage are connected to the first signal output terminal Outp and the second signal output terminal Outn, respectively. The amplification stage is configured to amplify the first output signals outp1 and outn1 to generate second output signals outp2 and outn2. A non-inverting input terminal and an inverting input terminal of the output buffer stage are connected to a non-inverting output terminal and an inverting output terminal of the amplification stage, respectively. The output buffer stage is configured to buffer the second output signals outp2 and outn2 to generate output signals outp and outn. A non-inverting input terminal of the differential amplifier is connected to the non-inverting output terminal of the output buffer stage through one low-pass filter. An inverting input terminal of the differential amplifier is connected to the non-inverting input terminal of the output buffer stage through the other low-pass filter. The two low-pass filters are configured to filter the output signals outp and outn of the output buffer stage to extract a pair of common-mode output signals G1 and G2 in the output signals outp and outn. The differential amplifier is configured to differentially amplify the common-mode output signals G1 and G2 to generate the compensation signals dcinp and dcinn for the input stage to cancel DC offset. The conventional DC offset cancellation circuit actually uses a closed-loop control method to generate the compensation signals dcinp and dcinn for the input stage to cancel DC offset. However, the conventional DC offset cancellation circuit can only be applied to a high-speed amplifier in an application environment (such as, in an optical communication system, a continuous-mode receiving amplifier circuit) where the amplitude of the input signals inp and inn is stable and continuous. It cannot be applied to a high-speed signal amplifier in an application environment (such as, in an optical communication system, a burst-mode receiving amplifier circuit) where the amplitude of the input signal inp and inn changes greatly and the change is not continuous. This is because the compensation signals dcinp and dcinn generated by the conventional DC offset cancellation circuit can not only be generated based on the DC offset caused by the cancellation process, but also based on the offset of the input signals inp and inn itself. In an application environment where the amplitude of the input signals inp and inn is stable and continuous, the compensation signals dcinp and dcinn can make corresponding changes in time according to the DC offset of the input signals inp and inn to cancel the DC offset of the input signals inp and inn. However, when the amplitude of the input signals inp and inn changes greatly and the change is not continuous in the application environment, if the conventional DC offset cancellation circuit cannot keep up with the change in the input signals inp and inn, the compensation signals dcinp and inn dcinn can't play a role in cancellation, but may produce an inverse effect, making the amplifier's signal distortion, and even causing the amplifier to oscillate.

SUMMARY OF THE INVENTION

The primary object of the present invention is to provide a DC offset cancellation circuit and a DC offset cancellation method.

In order to achieve the above object, the solution of the present invention is described below.

ADC offset cancellation circuit comprises a high-speed amplifier, a voltage comparator, a microprocessor, and a digital-to-analog converter. The high-speed amplifier includes an input stage with a DC offset cancellation function, an amplification stage, and an output buffer stage. The input stage has a first signal input terminal Inp, a second signal input terminal Inn, a first signal output terminal Outp, a second signal output terminal Outn, a first DC compensation terminal DCinp, and a second DC compensation terminal DCinn. The first signal input terminal Inp and the second signal input terminal Inn are configured to input input signals inp and inn, respectively. The first DC compensation terminal DCinp and the second DC compensation terminals DCinn are configured to input compensation signals dcinp and dcinn, respectively. The first signal output terminal Outp and the second signal output terminal Outn are configured to output first output signals outp1 and outn1, respectively. The first output signals outp1 and outn1 are generated by the input stage after processing the input signals inp and inn and the compensation signals dcinp and dcinn. A non-inverting input terminal and an inverting input terminal of the amplification stage are connected to the first signal output terminal Outp and the second signal output terminal Outn, respectively. The amplification stage is configured to amplify the first output signals outp1 and outn1 to generate second output signals outp2 and outn2. A non-inverting input terminal and an inverting input terminal of the output buffer stage are connected to a non-inverting output terminal and an inverting output terminal of the amplification stage respectively. The output buffer stage is configured to buffer the second output signals outp2 and outn2 to generate output signals outp and outn. A non-inverting input terminal of the voltage comparator is connected to a non-inverting output terminal of the output buffer stage through a low-pass filter. An inverting input terminal of the voltage comparator is connected to an inverting output terminal of the output buffer stage through another low-pass filter. The two low-pass filters are configured to filter the output signals outp and outn of the output buffer stage to extract a pair of common-mode output signals G1 and G2 in the output signals outp and outn. The voltage comparator is configured to compare the common-mode output signals G1 and G2 and convert a comparison result into a digital logic signal DLS. The microprocessor is connected to an output terminal of the voltage comparator. The microprocessor is configured to receive the digital logic signal DLS and generate a digital control signal DCS according to the digital logic signal DLS. A digital signal input terminal Din of the digital-to-analog converter is connected to the microprocessor. A first analog signal output terminal Aoutp and a second analog signal output terminal Aoutn of the digital-to-analog converter are connected to the first DC compensation terminal DCinp and the second DC compensation terminal DCinn of the input stage, respectively. The digital-to-analog converter is configured to receive the digital control signal DCS and generate the pair of compensation signals dcinp and dcinn according to the digital control signal DCS to be output to the first DC compensation terminal DCinp and the second DC compensation terminal DCinn of the input stage, respectively.

The digital signal input terminal Din of the digital-to-analog converter has n digital signal input terminals Din. n is a positive integer greater than or equal to 2. The n digital signal input terminals Din are sequentially from a first digital signal input terminal Din(1) to an nth digital signal input terminal Din(n). The digital signal input terminals Din of the digital-to-analog converter are connected to the microprocessor through a digital bus. The digital-to-analog converter includes a first conversion resistor R01, a second conversion resistor R02, and n conversion circuits. The n conversion circuits are sequentially from a first conversion circuit to an nth conversion circuit. One end of the first conversion resistor R01 and one end of the second conversion resistor R02 are grounded. The first conversion circuit includes a first inverter F1, a first current source i1, a first positive-phase controllable switch S1, and a first negative-phase controllable switch K1. An input terminal of the first current source i1 is connected to a working power supply VDD. An output terminal of the first current source i1 is connected to an input terminal of the first positive-phase controllable switch S1 and an input terminal of the first negative-phase controllable switch K1. An output current of the first current source i1 is i(0). An input terminal of the first inverter F1 is connected to the first digital signal input terminal Din(1). An output terminal of the first inverter F1 is connected to a control terminal of the first negative-phase controllable switch K1. An output terminal of the first negative-phase controllable switch K1 is connected to another terminal of the first conversion resistor R01 and the second analog signal output terminal Aoutn of the digital-to-analog converter. A control terminal of the first positive-phase controllable switch S1 is connected to the first digital signal input terminal Din(1). An output terminal of the first positive-phase controllable switch S1 is connected to another end of the second conversion resistor R02 and the first analog signal output terminal DCinp. The nth conversion circuit includes an nth inverter Fn, an nth current source in, an nth positive-phase controllable switch Sn, and an nth negative-phase controllable switch Kn. An input terminal of the nth current source in is connected to the working power supply VDD. An output terminal of the nth current source in is connected to an input terminal of the nth positive-phase controllable switch Sn and an input terminal of the nth negative-phase controllable switch Kn. An output current of the n-th current source in is i(n). i(n) is equal to 2 to the power of n times i(0). An input terminal of the nth inverter Fn is connected to the nth digital signal input terminal Din(n). An output terminal of the nth inverter Fn is connected to a control terminal of the nth negative-phase controllable switch Kn. An output terminal of the nth negative-phase controllable switch Kn is connected to the other terminal of the first conversion resistor R01 and the second analog signal output terminal Aoutn of the digital-to-analog converter. A control terminal of the nth positive-phase controllable switch Sn is connected to the nth digital signal input terminal Din(n). An output terminal of the nth positive-phase controllable switch Sn is connected to the other terminal of the second conversion resistor R02 and the first analog signal output terminal DCinp. The first positive-phase controllable switch S1 to the nth positive-phase controllable switch Sn and the first negative-phase controllable switch K1 to the nth negative-phase controllable switch Kn each have a same control level.

The input stage includes a first resistor R1, a second resistor R2, a first NMOS transistor Q1, a second NMOS transistor Q2, a third NMOS transistor Q3, a fourth NMOS transistor Q4, a first constant current source I0, a first voltage-controlled current source I1, and a second voltage-controlled current source I2. One end of the first resistor R1 is connected to the working power supply VDD. Another end of the first resistor R1 is connected to a drain of the first NMOS transistor Q1 and a drain of the third NMOS transistor Q3. One end of the second resistor R2 is connected to the working power supply VDD. Another end of the second resistor R2 is connected to a drain of the second NMOS transistor Q2 and a drain of the fourth NMOS transistor Q4. An input terminal of the first constant current source I0 is connected to a source of the first NMOS transistor Q1 and a source of the second NMOS transistor Q2. An output terminal of the first constant current source I0 is grounded. An input terminal of the first voltage-controlled current source I1 is connected to a source of the third NMOS transistor Q3. An output terminal of the first voltage-controlled current source I1 is grounded. An input terminal of the second voltage-controlled current source I2 is connected to a source of the fourth NMOS transistor Q4. An output terminal of the second voltage-controlled current source I2 is grounded. A control terminal of the first voltage-controlled current source I1 and a control terminal of the second voltage-controlled current source I2 serve as the second DC compensation terminal DCinn and the first DC compensation terminal DCinp of the input stage, respectively. A gate of the third NMOS transistor Q3 and a gate of the fourth NMOS transistor Q4 are connected to a bias power supply Vref. A common terminal of the third NMOS transistor Q3, the first NMOS transistor Q1 and the first resistor R1 serves as the second signal output terminal Outn of the input stage. A common terminal of the fourth NMOS transistor Q4, the second NMOS transistor Q2 and the second resistor R2 serves as the first signal output terminal Outp of the input stage. A gate of the first NMOS transistor Q1 and a gate of the second NMOS transistor Q2 serve as the first signal input terminal Inp and the second signal input terminal Inn of the input stage, respectively.

The input stage includes a third resistor R3, a fourth resistor R4, a fifth NMOS transistor Q5, a sixth NMOS transistor Q6, a seventh NMOS transistor Q7, an eighth NMOS transistor Q8, a second constant current source I3, and a third constant current source I4. One end of the third resistor R3 is connected to the working power supply VDD. Another end of the third resistor R3 is connected to a drain of the fifth NMOS transistor Q5 and a drain of the seventh NMOS transistor Q7. One end of the fourth resistor R4 is connected to the working power supply VDD. Another end of the fourth resistor R4 is connected to a drain of the sixth NMOS transistor Q6 and a drain of the eighth NMOS transistor Q8. An input terminal of the second constant current source I3 is connected to a source of the fifth NMOS transistor Q5 and a source of the sixth NMOS transistor Q6. An output terminal of the second constant current source I3 is grounded. An input terminal of the third constant current source I4 is connected to a source of the seventh NMOS transistor Q7 and a source of the eighth NMOS transistor Q8. An output terminal of the third constant current source I4 is grounded. A gate of the seventh NMOS transistor Q7 and a gate of the eighth NMOS transistor Q8 serve as the second DC compensation terminal DCinn and the first DC compensation terminal DCinp of the input stage, respectively. A common terminal of the seventh NMOS transistor Q7, the fifth NMOS transistor Q5 and the third resistor R3 serves as the second signal output terminal Outn of the input stage. A common end of the eighth NMOS transistor Q8, the sixth NMOS transistor Q6 and the fourth resistor R4 serves as the first signal output terminal Outp of the input stage. A gate of the fifth NMOS transistor Q5 and a gate of the sixth NMOS transistor Q6 serve as the first signal input terminal Inp and the second signal input terminal Inn of the input stage, respectively.

The input stage includes a fifth resistor R5, a sixth resistor R6, a seventh resistor R7, an eighth resistor R8, a capacitor C1, a ninth NMOS transistor Q9, a tenth NMOS transistor Q10, and a fourth constant current source I5. One end of the fifth resistor R5 is connected to the working power supply VDD. Another end of the fifth resistor R5 is connected to a drain of the ninth NMOS transistor Q9. A common terminal of the fifth resistor R5 and the ninth NMOS transistor Q9 serves as the second signal output terminal Outn of the input stage. One end of the sixth resistor R6 is connected to the working power supply VDD. Another end of the sixth resistor R6 is connected to the tenth NMOS transistor Q10. A common terminal of the sixth resistor R6 and the tenth NMOS transistor Q10 serves as the first signal output terminal Outp of the input stage. One end of the seventh resistor R7 is connected to a gate of the ninth NMOS transistor Q9. Another end of the seventh resistor R7 is connected to one end of the capacitor C1. A common terminal of the seventh resistor R7 and the ninth NMOS transistor Q9 serves as the first signal input terminal Inp of the input stage. A common terminal of the seventh resistor R7 and the capacitor C1 serves as the second DC compensation terminal DCinn of the input stage. One end of the eighth resistor R8 is connected to a gate of the tenth NMOS transistor Q10. Another end of the eighth resistor R8 is connected to another end of the capacitor C1. A common terminal of the eighth resistor R8 and the tenth NMOS transistor Q10 serves as the second signal input terminal Inn of the input stage. A common terminal of the eighth resistor R8 and the capacitor C1 serves as the first DC compensation terminal DCinp of the input stage. An input terminal of the fourth constant current source I5 is connected to a source of the ninth NMOS transistor Q9 and a source of the tenth NMOS transistor Q10. An output terminal of the fourth constant current source I5 is grounded.

A DC offset cancellation method is based on the foregoing DC offset cancellation circuit. The DC offset cancellation method is applied to an application environment where the first signal input terminal Inp and the second signal input terminal Inn of the input stage do not input the input signals inn and inp. The DC offset cancellation method comprises:

step 1: the microprocessor presetting a decimal initial value and assigning the initial value to the digital control signal DCS; the digital-to-analog converter receiving the digital control signal DCS and generating the corresponding compensation signals dcinp and dcinn to be output to the input stage for compensation according to the digital control signal DCS;

step 2: using the two low-pass filters to extract the common-mode output signals G1 and G2 in the output signals outp and outn of the output buffer stage; the voltage comparator comparing the common-mode output signals G1 and G2 with each other to output the digital logic signal DLS; wherein when the common-mode output signal G1 is greater than the common-mode output signal G2, the digital logic signal DLS output from the voltage comparator being at a high level; when the common-mode output signal G1 is less than the common-mode output signal G2, the digital logic signal DLS output from the voltage comparator is at a low level;

step 3: the microprocessor reading the digital logic signal DLS generated by the voltage comparator and judging the digital logic signal DLS, if the digital logic signal DLS is at the high level, going to step 4; if the digital logic signal DLS is at the low level, going to step 5;

step 4: the microprocessor adding one to the initial value and assigning the processed initial value to the digital control signal DCS, and the digital-to-analog converter generating the corresponding compensation signals dcinp and dcinn to be output to the input stage for compensation according to the digital control signal DCS, and then repeating step 2, the microprocessor reading the digital logic signal DLS of the voltage comparator again and making a judgement, if the digital logic signal DLS is at the low level, the microprocessor keeping an assignment of the digital control signal DCS unchanged, otherwise repeating step 4;

step 5: the microprocessor subtracting one from the initial value and assigning the processed initial value to the digital control signal DCS, and the digital-to-analog converter generating the corresponding compensation signals dcinp and dcinn to be output to the input stage for compensation according to the digital control signal DCS, and then repeating step 2, the microprocessor reading the digital logic signal DLS of the voltage comparator again and making a judgement, if the digital logic signal DLS is at the high level, the microprocessor keeping the assignment of the digital control signal DCS unchanged, otherwise repeating step 5.

After adopting the above solutions, the DC offset cancellation circuit of the present invention provides the compensation signals dcinp and dcinn to the input stage to cancel the DC offset of the high-speed amplifier by means of a digital-analog hybrid control method. The DC offset cancellation circuit has the microprocessor, so the compensation signals dcinp and dcinn can be locked by the microprocessor to ensure the DC offset cancellation caused by the stable cancellation process. In this way, even when the input signals inp and inn are subsequently input, the locked compensation signals dcinp and dcinn are still in the locked state and will not be affected by the input signals inp and inn. The DC offset cancellation circuit only cancels the DC offset caused by the cancellation process, and can avoid the problem that the high-speed amplifier cannot work normally since the compensation signals do not correspondingly change with the input signals inp and inn in time. Therefore, the DC offset cancellation circuit can work when the amplitude of the input signals inp and inn changes greatly and the change is not continuous.

Therefore, through the DC offset cancellation method of the present invention, when the input stage of the high-speed amplifier does not have the input signals inp and inn, the DC offset cancellation circuit generates the compensation signals dcinp and dcinn to cancel the DC offset caused by the cancellation process of the high-speed amplifier. Furthermore, the compensation signals dcinp and dcinn can be locked through the microprocessor to ensure the cancellation of the DC offset caused by the stable cancellation process. In this way, when the amplitude of the subsequent input signals inp and inn changes greatly and the change is not continuous, the microprocessor can ensure that the locked compensation signals dcinp and dcinn are still in the locked state and are not affected by the input signals inp and inn. Therefore, the DC offset cancellation circuit can avoid the problem that the high-speed amplifier cannot work normally since the compensation signals do not correspondingly change with the input signals inp and inn in time.

DETAILED DESCRIPTION OF THE PREFERRED EMBODIMENTS

Figure 1:
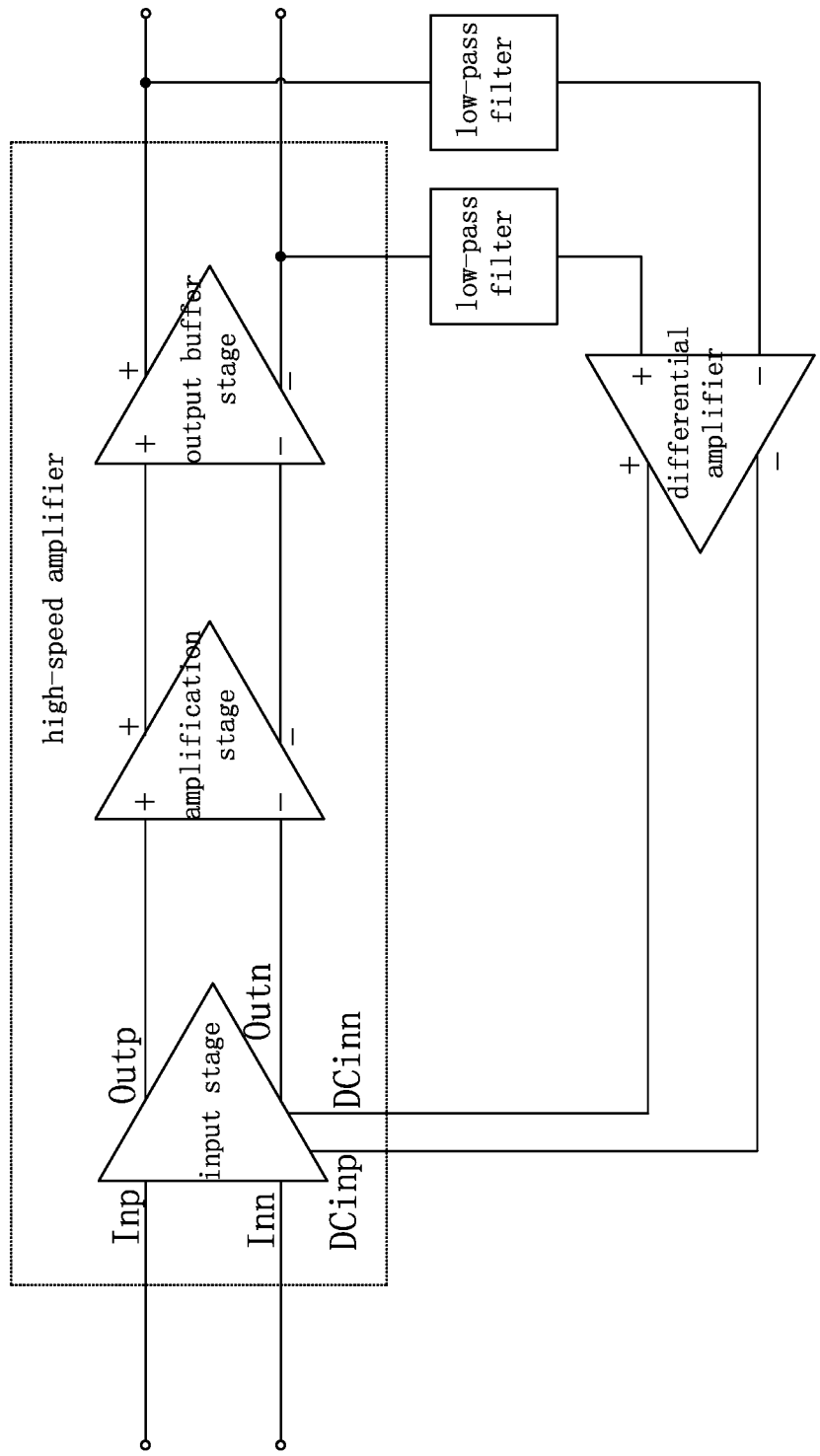
FIG. 1 is a schematic diagram of a conventional DC offset cancellation circuit.
Figure 2:
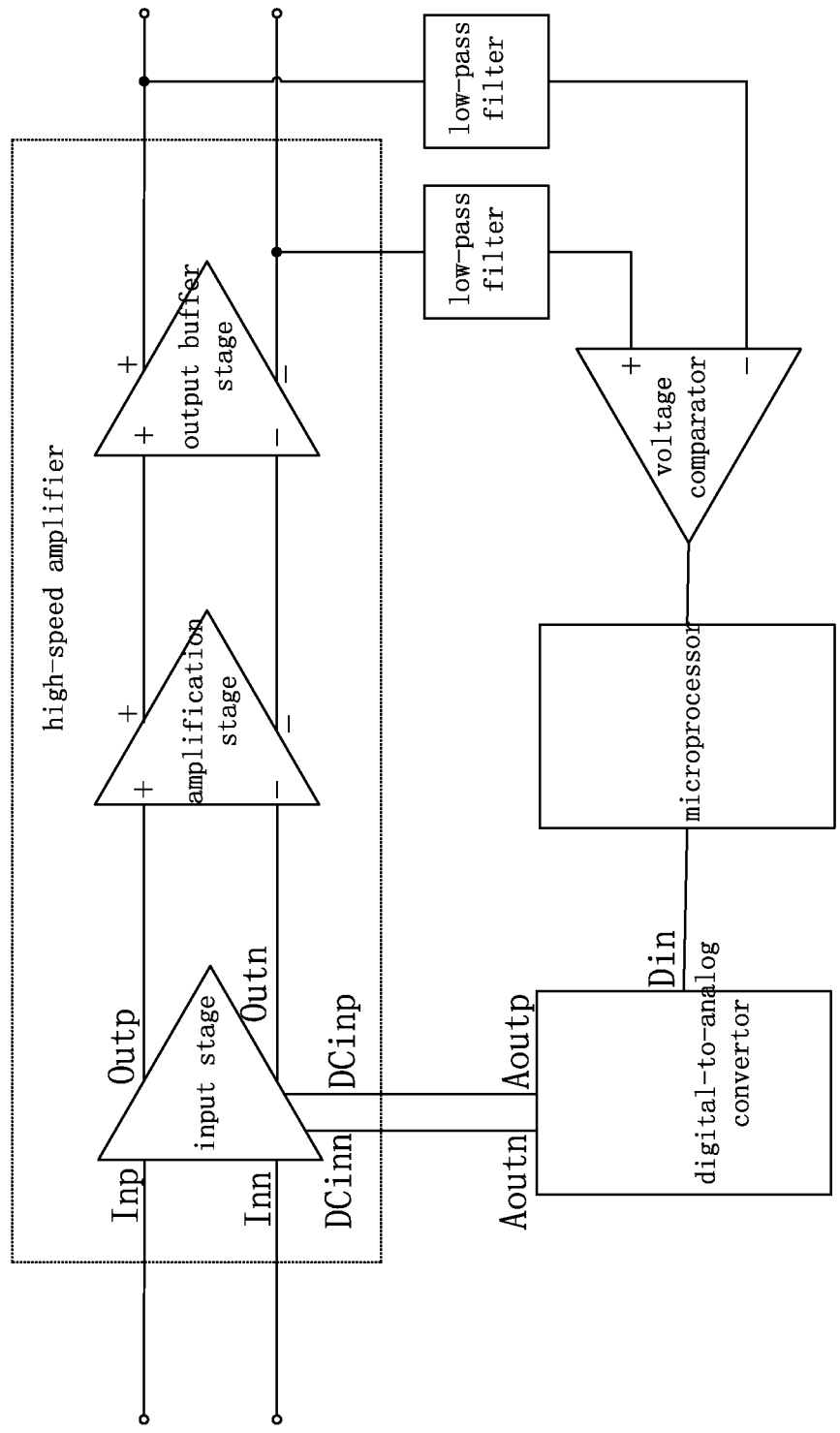
FIG. 2 is a schematic diagram of the DC offset cancellation circuit of the present invention.

Embodiments of the present invention will now be described, by way of example only, with reference to the accompanying drawings.

As shown in FIG. 2 through FIG. 6, the present invention discloses a DC offset cancellation circuit. The DC offset cancellation circuit comprises a high-speed amplifier, a voltage comparator, a microprocessor, and a digital-to-analog converter. The high-speed amplifier comprises an input stage with a DC offset cancellation function, an amplification stage, and an output buffer stage. The input stage has a first signal input terminal Inp, a second signal input terminal Inn, a first signal output terminal Outp, a second signal output terminal Outn, a first DC compensation terminal DCinp, and a second DC compensation terminal DCinn. The first signal input terminal Inp and the second signal input terminal Inn are configured to input input signals inp and inn, respectively. The first DC compensation terminal DCinp and the second DC compensation terminals DCinn are configured to input compensation signals dcinp and dcinn, respectively. The first signal output terminal Outp and the second signal output terminal Outn are configured to output first output signals outp1 and outn1, respectively. The first output signals outp1 and outn1 are generated by the input stage after processing the input signals inp and inn and the compensation signals dcinp and dcinn. A non-inverting input terminal and an inverting input terminal of the amplification stage are connected to the first signal output terminal Outp and the second signal output terminal Outn, respectively. The amplification stage is configured to amplify the first output signals outp1 and outn1 to generate second output signals outp2 and outn2. A non-inverting input terminal and an inverting input terminal of the output buffer stage are connected to a non-inverting output terminal and an inverting output terminal of the amplification stage, respectively. The output buffer stage is configured to buffer the second output signals outp2 and outn2 to generate output signals outp and outn. A non-inverting input terminal of the voltage comparator is connected to a non-inverting output terminal of the output buffer stage through a low-pass filter. An inverting input terminal of the voltage comparator is connected to an inverting output terminal of the output buffer stage through another low-pass filter. The two low-pass filters are configured to filter the output signals outp and outn of the output buffer stage to extract a pair of common-mode output signals G1 and G2 in the output signals outp and outn. The voltage comparator is configured to compare the common-mode output signals G1 and G2 and convert a comparison result into a digital logic signal DLS. The microprocessor is connected to an output terminal of the voltage comparator. The microprocessor is configured to receive the digital logic signal DLS and generate a digital control signal DCS according to the digital logic signal DLS. A digital signal input terminal Din of the digital-to-analog converter is connected to the microprocessor. A first analog signal output terminal Aoutp and a second analog signal output terminal Aoutn of the digital-to-analog converter are connected to the first DC compensation terminal DCinp and the second DC compensation terminal DCinn of the input stage, respectively. The digital-to-analog converter is configured to receive the digital control signal DCS and generate the pair of compensation signals dcinp and dcinn according to the digital control signal DCS to be output to the first DC compensation terminal DCinp and the second DC compensation terminal DCinn of the input stage, respectively.

The DC offset cancellation circuit of the present invention provides the compensation signals dcinp and dcinn to the input stage to cancel the DC offset of the high-speed amplifier by means of a digital-analog hybrid control method. The DC offset cancellation circuit has the microprocessor, so the compensation signals dcinp and dcinn can be locked by the microprocessor to ensure the DC offset cancellation caused by the stable cancellation process. In this way, even when the input signals inp and inn are subsequently input, the locked compensation signals dcinp and dcinn are still in the locked state and will not be affected by the input signals inp and inn. The DC offset cancellation circuit only cancels the DC offset caused by the cancellation process, and can avoid the problem that the high-speed amplifier cannot work normally since the compensation signals do not correspondingly change with the input signals inp and inn in time. Therefore, the DC offset cancellation circuit can work when the amplitude of the input signals inp and inn changes greatly and the change is not continuous.

In order to facilitate the understanding of the DC offset cancellation circuit, the circuit structure of the digital-to-analog converter and the input stage will be described in detail below. The amplification stage may be a combination of a differential amplifier and a limiting amplifier in the prior art. The output buffer stage may be an output buffer. The low-pass filter and the voltage comparator are common techniques in this field, and will not be further explained.

Figure 3:
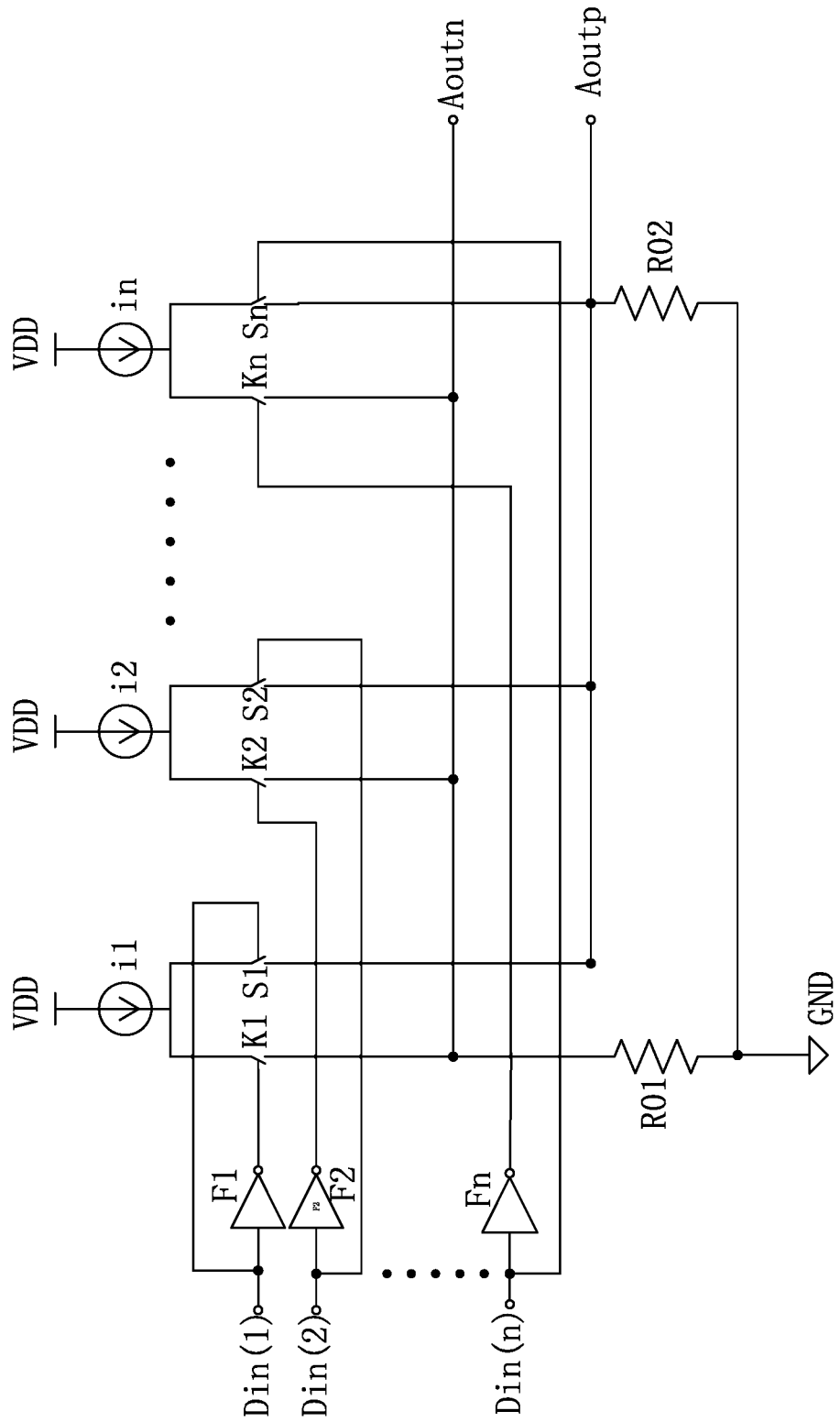
FIG. 3 is a schematic diagram of the digital-to-analog converter of the present invention.

As shown in FIG. 3, the digital-to-analog converter has n digital signal input terminals Din, and n is a positive integer greater than or equal to 2. The n digital signal input terminals Din are sequentially from a first digital signal input terminal Din(1) to an nth digital signal input terminal Din(n). The digital signal input terminals Din of the digital-to-analog converter are connected to the microprocessor through a digital bus. The digital-to-analog converter includes a first conversion resistor R01, a second conversion resistor R02, and n conversion circuits. The n conversion circuits are sequentially from a first conversion circuit to an nth conversion circuit. One end of the first conversion resistor R01 and one end of the second conversion resistor R02 are grounded. The first conversion circuit includes a first inverter F1, a first current source i1, a first positive-phase controllable switch S1, and a first negative-phase controllable switch K1. An input terminal of the first current source i1 is connected to a working power supply VDD. An output terminal of the first current source i1 is connected to an input terminal of the first positive-phase controllable switch S1 and an input terminal of the first negative-phase controllable switch K1. An output current of the first current source i1 is i(0). An input terminal of the first inverter F1 is connected to the first digital signal input terminal Din(1). An output terminal of the first inverter F1 is connected to a control terminal of the first negative-phase controllable switch K1. An output terminal of the first negative-phase controllable switch K1 is connected to another terminal of the first conversion resistor R01 and the second analog signal output terminal Aoutn of the digital-to-analog converter. A control terminal of the first positive-phase controllable switch S1 is connected to the first digital signal input terminal Din(1). An output terminal of the first positive-phase controllable switch S1 is connected to another end of the second conversion resistor R02 and the first analog signal output terminal DCinp. The nth conversion circuit includes an nth inverter Fn, an nth current source in, an nth positive-phase controllable switch Sn, and an nth negative-phase controllable switch Kn. An input terminal of the nth current source in is connected to the working power supply VDD. An output terminal of the nth current source in is connected to an input terminal of the nth positive-phase controllable switch Sn and an input terminal of the nth negative-phase controllable switch Kn. An output current of the n-th current source in is i(n). i(n) is equal to 2 to the power of n times i(0). An input terminal of the nth inverter Fn is connected to the nth digital signal input terminal Din(n). An output terminal of the nth inverter Fn is connected to a control terminal of the nth negative-phase controllable switch Kn. An output terminal of the nth negative-phase controllable switch Kn is connected to the other terminal of the first conversion resistor R01 and the second analog signal output terminal Aoutn of the digital-to-analog converter. A control terminal of the nth positive-phase controllable switch Sn is connected to the nth digital signal input terminal Din(n). An output terminal of the nth positive-phase controllable switch Sn is connected to the other terminal of the second conversion resistor R02 and the first analog signal output terminal DCinp. Control levels of the first positive-phase controllable switch S1 to the nth positive-phase controllable switch Sn and the first negative-phase controllable switch K1 to the nth negative-phase controllable switch Kn are the same.

Figure 4:
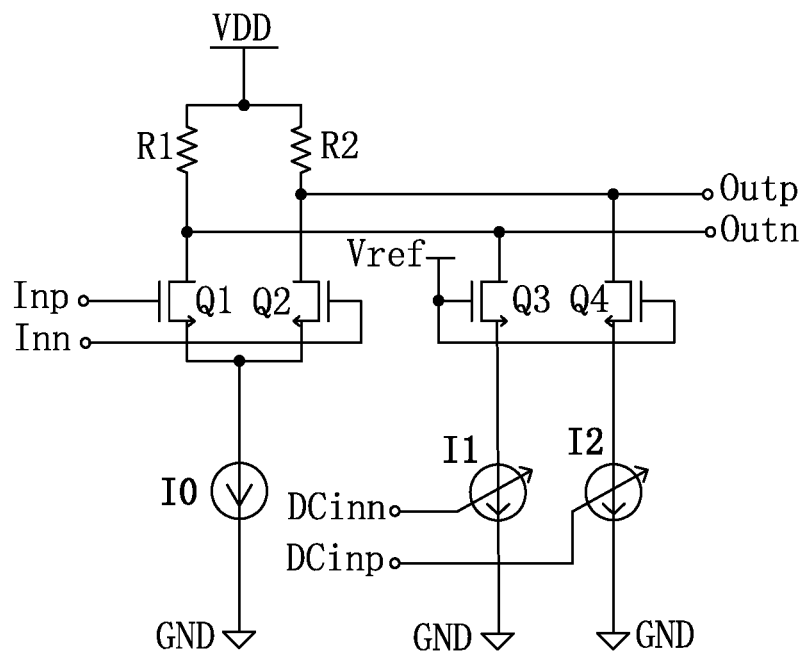
FIG. 4 is a schematic diagram of a first exemplary embodiment of the input stage of the present invention.

The present invention provides three input stage structures. As shown in FIG. 4, the input stage may include a first resistor R1, a second resistor R2, a first NMOS transistor Q1, a second NMOS transistor Q2, a third NMOS transistor Q3, a fourth NMOS transistor Q4, a first constant current source I0, a first voltage-controlled current source I1, and a second voltage-controlled current source I2. One end of the first resistor R1 is connected to the working power supply VDD. Another end of the first resistor R1 is connected to a drain of the first NMOS transistor Q1 and a drain of the third NMOS transistor Q3. One end of the second resistor R2 is connected to the working power supply VDD. Another end of the second resistor R2 is connected to a drain of the second NMOS transistor Q2 and a drain of the fourth NMOS transistor Q4. An input terminal of the first constant current source I0 is connected to a source of the first NMOS transistor Q1 and a source of the second NMOS transistor Q2. An output terminal of the first constant current source I0 is grounded. An input terminal of the first voltage-controlled current source I1 is connected to a source of the third NMOS transistor Q3. An output terminal of the first voltage-controlled current source I1 is grounded. An input terminal of the second voltage-controlled current source I2 is connected to a source of the fourth NMOS transistor Q4. An output terminal of the second voltage-controlled current source I2 is grounded. A control terminal of the first voltage-controlled current source I1 and a control terminal of the second voltage-controlled current source I2 serve as the second DC compensation terminal DCinn and the first DC compensation terminal DCinp of the input stage, respectively. A gate of the third NMOS transistor Q3 and a gate of the fourth NMOS transistor Q4 are connected to a bias power supply Vref. A common terminal of the third NMOS transistor Q3, the first NMOS transistor Q1 and the first resistor R1 serves as the second signal output terminal Outn of the input stage. A common terminal of the fourth NMOS transistor Q4, the second NMOS transistor Q2 and the second resistor R2 serves as the first signal output terminal Outp of the input stage. A gate of the first NMOS transistor Q1 and a gate of the second NMOS transistor Q2 serve as the first signal input terminal Inp and the second signal input terminal Inn of the input stage, respectively.

Figure 5:
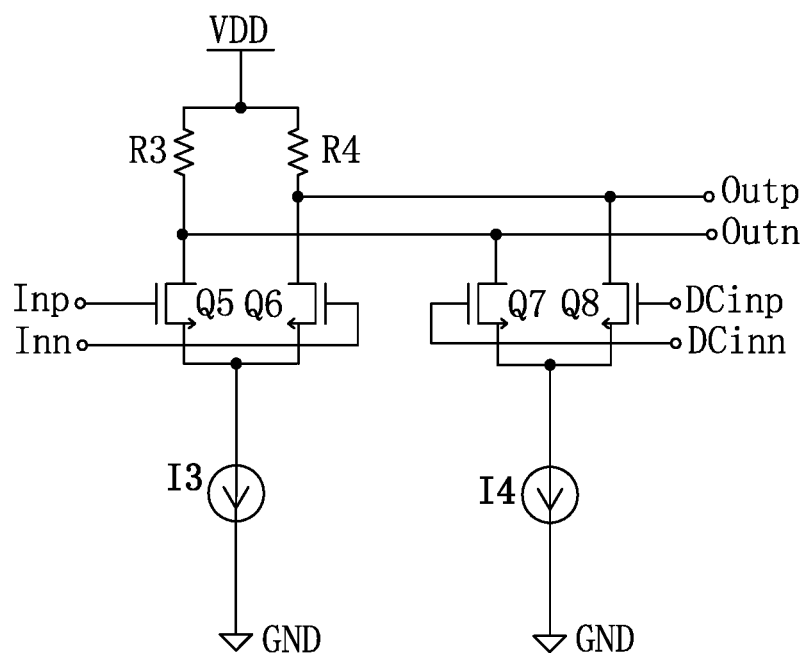
FIG. 5 is a schematic diagram of a second exemplary embodiment of the input stage of the present invention.

As shown in FIG. 5, the input stage may include a third resistor R3, a fourth resistor R4, a fifth NMOS transistor Q5, a sixth NMOS transistor Q6, a seventh NMOS transistor Q7, an eighth NMOS transistor Q8, a second constant current source I3, and a third constant current source I4. One end of the third resistor R3 is connected to the working power supply VDD. Another end of the third resistor R3 is connected to a drain of the fifth NMOS transistor Q5 and a drain of the seventh NMOS transistor Q7. One end of the fourth resistor R4 is connected to the working power supply VDD. Another end of the fourth resistor R4 is connected to a drain of the sixth NMOS transistor Q6 and a drain of the eighth NMOS transistor Q8. An input terminal of the second constant current source I3 is connected to a source of the fifth NMOS transistor Q5 and a source of the sixth NMOS transistor Q6. An output terminal of the second constant current source I3 is grounded. An input terminal of the third constant current source I4 is connected to a source of the seventh NMOS transistor Q7 and a source of the eighth NMOS transistor Q8. An output terminal of the third constant current source I4 is grounded. A gate of the seventh NMOS transistor Q7 and a gate of the eighth NMOS transistor Q8 serve as the second DC compensation terminal DCinn and the first DC compensation terminal DCinp of the input stage, respectively. A common terminal of the seventh NMOS transistor Q7, the fifth NMOS transistor Q5 and the third resistor R3 serves as the second signal output terminal Outn of the input stage. A common end of the eighth NMOS transistor Q8, the sixth NMOS transistor Q6 and the fourth resistor R4 serves as the first signal output terminal Outp of the input stage. A gate of the fifth NMOS transistor Q5 and a gate of the sixth NMOS transistor Q6 serve as the first signal input terminal Inp and the second signal input terminal Inn of the input stage, respectively.

Figure 6:
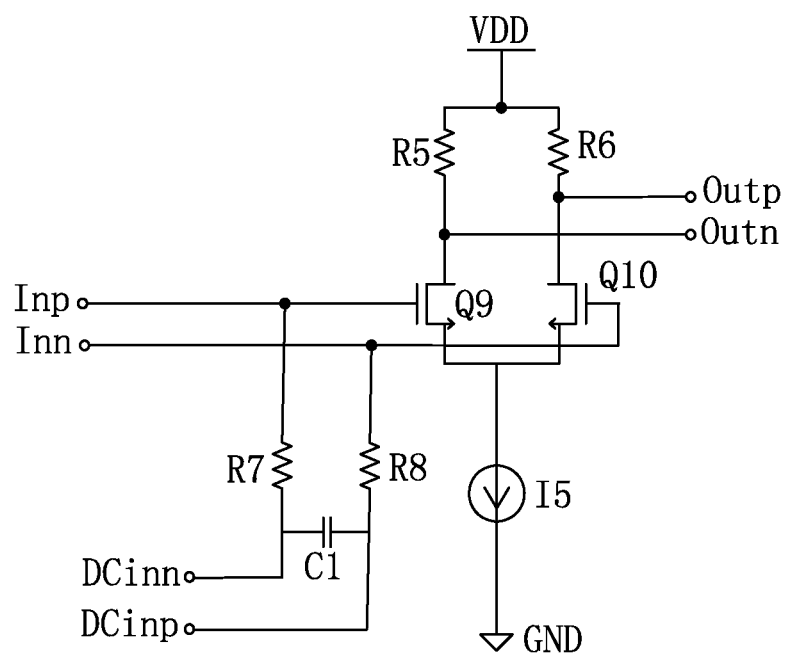
FIG. 6 is a schematic diagram of a third exemplary embodiment of the input stage of the present invention.

As shown in FIG. 6, the input stage may include a fifth resistor R5, a sixth resistor R6, a seventh resistor R7, an eighth resistor R8, a capacitor C1, a ninth NMOS transistor Q9, a tenth NMOS transistor Q10, and a fourth constant current source I5. One end of the fifth resistor R5 is connected to the working power supply VDD. Another end of the fifth resistor R5 is connected to a drain of the ninth NMOS transistor Q9. A common terminal of the fifth resistor R5 and the ninth NMOS transistor Q9 serves as the second signal output terminal Outn of the input stage. One end of the sixth resistor R6 is connected to the working power supply VDD. Another end of the sixth resistor R6 is connected to the tenth NMOS transistor Q10. A common terminal of the sixth resistor R6 and the tenth NMOS transistor Q10 serves as the first signal output terminal Outp of the input stage. One end of the seventh resistor R7 is connected to a gate of the ninth NMOS transistor Q9. Another end of the seventh resistor R7 is connected to one end of the capacitor C1. A common terminal of the seventh resistor R7 and the ninth NMOS transistor Q9 serves as the first signal input terminal Inp of the input stage. A common terminal of the seventh resistor R7 and the capacitor C1 serves the second DC compensation terminal DCinn of the input stage. One end of the eighth resistor R8 is connected to a gate of the tenth NMOS transistor Q10. Another end of the eighth resistor R8 is connected to another end of the capacitor C1. A common terminal of the eighth resistor R8 and the tenth NMOS transistor Q10 serves as the second signal input terminal Inn of the input stage. A common terminal of the eighth resistor R8 and the capacitor C1 serves as the first DC compensation terminal DCinp of the input stage. An input terminal of the fourth constant current source I5 is connected to a source of the ninth NMOS transistor Q9 and a source of the tenth NMOS transistor Q10. An output terminal of the fourth constant current source I5 is grounded.

Figure 7:
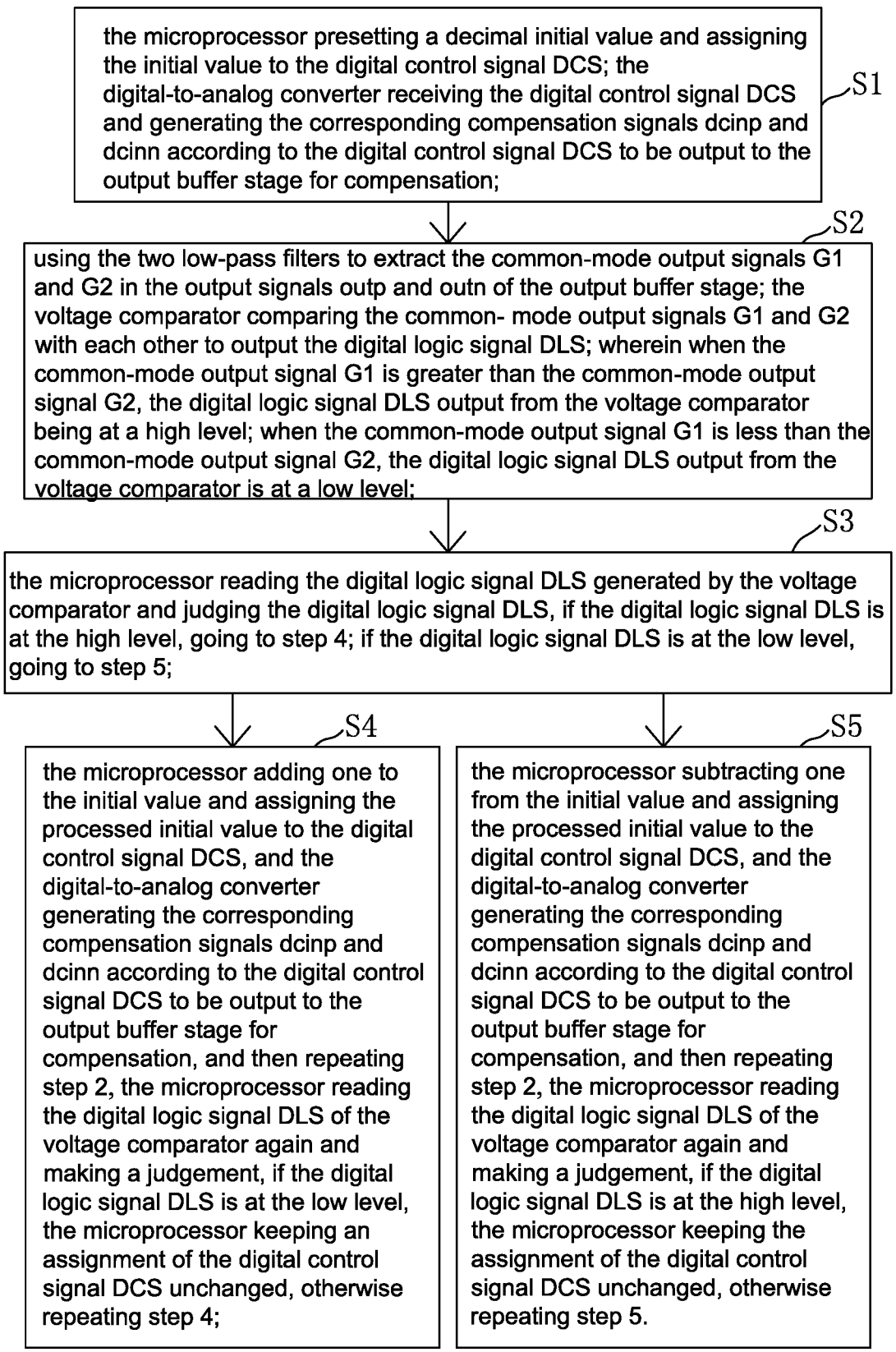
FIG. 7 is a flowchart of the DC offset cancellation method of the present invention.

The present invention further provides a DC offset cancellation method. The DC offset cancellation method is based on the above-mentioned DC offset cancellation circuit. The DC offset cancellation method is applied to an application environment where the first signal input terminal Inp and the second signal input terminal Inn of the input stage do not input the input signals inn and inp. As shown in FIG. 7, the DC offset cancellation method comprises:

step 1, S1: the microprocessor presetting a decimal initial value and assigning the initial value to the digital control signal DCS; then the digital-to-analog converter receiving the digital control signal DCS and generating the corresponding compensation signals dcinp and dcinn to be output to the input stage for compensation according to the digital control signal DCS;

step 2, S2: using the two low-pass filters to extract the common-mode output signals G1 and G2 in the output signals outp and outn of the output buffer stage; then the voltage comparator comparing the common-mode output signals G1 and G2 with each other to output the digital logic signal DLS; wherein when the common-mode output signal G1 is greater than the common-mode output signal G2, the digital logic signal DLS output from the voltage comparator being at a high level; when the common-mode output signal G1 is less than the common-mode output signal G2, the digital logic signal DLS output from the voltage comparator is at a low level;

step 3, S3: the microprocessor reading the digital logic signal DLS generated by the voltage comparator and judging the digital logic signal DLS, if the digital logic signal DLS is at the high level, going to step 4; if the digital logic signal DLS is at the low level, going to step 5;

step 4, S4: the microprocessor adding one to the initial value and assigning the processed initial value to the digital control signal DCS, and then the digital-to-analog converter generating the corresponding compensation signals dcinp and dcinn to be output to the input stage for compensation according to the digital control signal DCS, and then repeating step 2, then the microprocessor reading the digital logic signal DLS of the voltage comparator again and making a judgement, if the digital logic signal DLS is at the low level, the microprocessor keeping the assignment of the digital control signal DCS unchanged, otherwise repeating step 4; the compensation signals dcinp and dcinn being locked to ensure the DC offset cancellation caused by the stable cancellation process;

Step 5, S5: the microprocessor subtracting one from the initial value and assigning the processed initial value to the digital control signal DCS, and then the digital-to-analog converter generating the corresponding compensation signals dcinp and dcinn to be output to the input stage for compensation according to the digital control signal DCS, and then repeating step 2, then the microprocessor reading the digital logic signal DLS of the voltage comparator again and making a judgement, if the digital logic signal DLS is at the high level, the microprocessor keeping the assignment of the digital control signal DCS unchanged, otherwise repeating step 5.

When the microprocessor keeps the assignment of the digital control signal DCS unchanged, it is assumed that the digital-to-analog converter generates the compensation signals dcinp and dcinn through the digital control signal DCS at this time to cancel the DC offset caused by the cancellation process. In addition, the microprocessor keeps the assignment of the digital control signal DCS assignment unchanged, and the corresponding compensation signals dcinp and dcinn are also unchanged, that is, the compensation signals dcinp and dcinn are locked. Therefore, through the DC offset cancellation method, when the input stage of the high-speed amplifier does not have the input signals inp and inn, the DC offset cancellation circuit generates the compensation signals dcinp and dcinn to cancel the DC offset caused by the cancellation process of the high-speed amplifier. Furthermore, the compensation signals dcinp and dcinn can be locked through the microprocessor to ensure the cancellation of the DC offset caused by the stable cancellation process. In this way, when the amplitude of the subsequent input signals inp and inn changes greatly and the change is not continuous, the microprocessor can ensure that the locked compensation signals dcinp and dcinn are still in the locked state and are not affected by the input signals inp and inn. Therefore, the DC offset cancellation circuit only cancels the DC offset caused by the stable cancellation process, and can avoid the problem that the high-speed amplifier cannot work normally since the compensation signals do not correspondingly change with the input signals inp and inn in time.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A DC offset cancellation circuit, comprising a high-speed amplifier, a voltage comparator, a microprocessor, and a digital-to-analog converter;

the high-speed amplifier including an input stage with a DC offset cancellation function, an amplification stage, and an output buffer stage; the input stage having a first signal input terminal Inp, a second signal input terminal Inn, a first signal output terminal Outp, a second signal output terminal Outn, a first DC compensation terminal DCinp, and a second DC compensation terminal DCinn; the first signal input terminal Inp and the second signal input terminal Inn being configured to input signals inp and inn, respectively; the first DC compensation terminal DCinp and the second DC compensation terminals DCinn being configured to input compensation signals dcinp and dcinn respectively, the first signal output terminal Outp and the second signal output terminal Outn being configured to output first output signals outp1 and outn1, respectively; the first output signals outp1 and outn1 being generated by the input stage after processing the input signals inp and inn and the compensation signals dcinp and dcinn; a non-inverting input terminal and an inverting input terminal of the amplification stage being connected to the first signal output terminal Outp and the second signal output terminal Outn, respectively; the amplification stage being configured to amplify the first output signals outp1 and outn1 to generate second output signals outp2 and outn2; a non-inverting input terminal and an inverting input terminal of the output buffer stage being connected to a non-inverting output terminal and an inverting output terminal of the amplification stage respectively, the output buffer stage being configured to buffer the second output signals outp2 and outn2 to generate output signals outp and outn;

a non-inverting input terminal of the voltage comparator being connected to a non-inverting output terminal of the output buffer stage through a low-pass filter; an inverting input terminal of the voltage comparator being connected to an inverting output terminal of the output buffer stage through another low-pass filter; the two low-pass filters being configured to filter the output signals outp and outn of the output buffer stage to extract a pair of common-mode output signals G1 and G2 in the output signals outp and outn; the voltage comparator being configured to compare the common-mode output signals G1 and G2 and convert a comparison result into a digital logic signal DLS; the microprocessor being connected to an output terminal of the voltage comparator; the microprocessor being configured to receive the digital logic signal DLS and generate a digital control signal DCS according to the digital logic signal DLS;

a digital signal input terminal Din of the digital-to-analog converter being connected to the microprocessor, a first analog signal output terminal Aoutp and a second analog signal output terminal Aoutn of the digital-to-analog converter being connected to the first DC compensation terminal DCinp and the second DC compensation terminal DCinn of the input stage respectively, the digital-to-analog converter being configured to receive the digital control signal DCS and generate the pair of compensation signals dcinp and dcinn according to the digital control signal DCS to be output to the first DC compensation terminal DCinp and the second DC compensation terminal DCinn of the input stage, respectively; wherein the digital signal input terminal Din of the digital-to-analog converter has n digital signal input terminals Din, n is a positive integer greater than or equal to 2; the n digital signal input terminals Din are sequentially from a first digital signal input terminal Din(1) to an nth digital signal input terminal Din(n); the digital signal input terminals Din of the digital-to-analog converter being connected to the microprocessor through a digital bus;

the digital-to-analog converter includes a first conversion resistor R01, a second conversion resistor R02, and n conversion circuits; the n conversion circuits are sequentially from a first conversion circuit to an nth conversion circuit; one end of the first conversion resistor R01 and one end of the second conversion resistor R02 are grounded;

the first conversion circuit includes a first inverter F1, a first current source i1, a first positive-phase controllable switch S1, and a first negative-phase controllable switch K1; an input terminal of the first current source i1 is connected to a working power supply VDD, an output terminal of the first current source i1 is connected to an input terminal of the first positive-phase controllable switch S1 and an input terminal of the first negative-phase controllable switch K1; an output current of the first current source i1 is i(0); an input terminal of the first inverter F1 is connected to the first digital signal input terminal Din(1), an output terminal of the first inverter F1 is connected to a control terminal of the first negative-phase controllable switch K1; an output terminal of the first negative-phase controllable switch K1 is connected to another terminal of the first conversion resistor R01 and the second analog signal output terminal Aoutn of the digital-to-analog converter; a control terminal of the first positive-phase controllable switch S1 is connected to the first digital signal input terminal Din(1), an output terminal of the first positive-phase controllable switch S1 is connected to another end of the second conversion resistor R02 and the first analog signal output terminal DCinp;

the nth conversion circuit includes an nth inverter Fn, an nth current source in, an nth positive-phase controllable switch Sn, and an nth negative-phase controllable switch Kn; an input terminal of the nth current source in is connected to the working power supply VDD, an output terminal of the nth current source in is connected to an input terminal of the nth positive-phase controllable switch Sn and an input terminal of the nth negative-phase controllable switch Kn; an output current of the n-th current source in is i(n), i(n) is equal to 2 to the power of n times i(0); an input terminal of the nth inverter Fn is connected to the nth digital signal input terminal Din(n), an output terminal of the nth inverter Fn is connected to a control terminal of the nth negative-phase controllable switch Kn; an output terminal of the nth negative-phase controllable switch Kn is connected to the another terminal of the first conversion resistor R01 and the second analog signal output terminal Aoutn of the digital-to-analog converter; a control terminal of the nth positive-phase controllable switch Sn is connected to the nth digital signal input terminal Din(n), an output terminal of the nth positive-phase controllable switch Sn is connected to the another terminal of the second conversion resistor R02 and the first analog signal output terminal DCinp;

the first positive-phase controllable switch S1 to the nth positive-phase controllable switch Sn and the first negative-phase controllable switch K1 to the nth negative-phase controllable switch Kn each have a same control level.

2. The DC offset cancellation circuit as claimed in claim 1, wherein the input stage includes a first resistor R1, a second resistor R2, a first NMOS transistor Q1, a second NMOS transistor Q2, a third NMOS transistor Q3, a fourth NMOS transistor Q4, a first constant current source I0, a first voltage-controlled current source I1, and a second voltage-controlled current source I2;

one end of the first resistor R1 is connected to the working power supply VDD, another end of the first resistor R1 is connected to a drain of the first NMOS transistor Q1 and a drain of the third NMOS transistor Q3;

one end of the second resistor R2 is connected to the working power supply VDD, another end of the second resistor R2 is connected to a drain of the second NMOS transistor Q2 and a drain of the fourth NMOS transistor Q4;

an input terminal of the first constant current source I0 is connected to a source of the first NMOS transistor Q1 and a source of the second NMOS transistor Q2; an output terminal of the first constant current source I0 is grounded;

an input terminal of the first voltage-controlled current source I1 is connected to a source of the third NMOS transistor Q3, an output terminal of the first voltage-controlled current source I1 is grounded; an input terminal of the second voltage-controlled current source I2 is connected to a source of the fourth NMOS transistor Q4, an output terminal of the second voltage-controlled current source I2 is grounded; a control terminal of the first voltage-controlled current source I1 and a control terminal of the second voltage-controlled current source I2 serve as the second DC compensation terminal DCinn and the first DC compensation terminal DCinp of the input stage, respectively;

a gate of the third NMOS transistor Q3 and a gate of the fourth NMOS transistor Q4 are connected to a bias power supply Vref; a common terminal of the third NMOS transistor Q3, the first NMOS transistor Q1 and the first resistor R1 serves as the second signal output terminal Outn of the input stage; a common terminal of the fourth NMOS transistor Q4, the second NMOS transistor Q2 and the second resistor R2 serves as the first signal output terminal Outp of the input stage; a gate of the first NMOS transistor Q1 and a gate of the second NMOS transistor Q2 serve as the first signal input terminal Inp and the second signal input terminal Inn of the input stage, respectively.

3. The DC offset cancellation circuit as claimed in claim 1, wherein the input stage includes a third resistor R3, a fourth resistor R4, a fifth NMOS transistor Q5, a sixth NMOS transistor Q6, a seventh NMOS transistor Q7, an eighth NMOS transistor Q8, a second constant current source I3, and a third constant current source I4;

one end of the third resistor R3 is connected to the working power supply VDD, another end of the third resistor R3 is connected to a drain of the fifth NMOS transistor Q5 and a drain of the seventh NMOS transistor Q7;

one end of the fourth resistor R4 is connected to the working power supply VDD, another end of the fourth resistor R4 is connected to a drain of the sixth NMOS transistor Q6 and a drain of the eighth NMOS transistor Q8;

an input terminal of the second constant current source I3 is connected to a source of the fifth NMOS transistor Q5 and a source of the sixth NMOS transistor Q6, an output terminal of the second constant current source I3 is grounded;

an input terminal of the third constant current source I4 is connected to a source of the seventh NMOS transistor Q7 and a source of the eighth NMOS transistor Q8, an output terminal of the third constant current source I4 is grounded;

a gate of the seventh NMOS transistor Q7 and a gate of the eighth NMOS transistor Q8 serve as the second DC compensation terminal DCinn and the first DC compensation terminal DCinp of the input stage, respectively;

a common terminal of the seventh NMOS transistor Q7, the fifth NMOS transistor Q5 and the third resistor R3 serves as the second signal output terminal Outn of the input stage; a common end of the eighth NMOS transistor Q8, the sixth NMOS transistor Q6 and the fourth resistor R4 serves as the first signal output terminal Outp of the input stage; a gate of the fifth NMOS transistor Q5 and a gate of the sixth NMOS transistor Q6 serve as the first signal input terminal Inp and the second signal input terminal Inn of the input stage, respectively.

4. The DC offset cancellation circuit as claimed in claim 1, wherein the input stage includes a fifth resistor R5, a sixth resistor R6, a seventh resistor R7, an eighth resistor R8, a capacitor C1, a ninth NMOS transistor Q9, a tenth NMOS transistor Q10, and a fourth constant current source I5;

one end of the fifth resistor R5 is connected to the working power supply VDD, another end of the fifth resistor R5 is connected to a drain of the ninth NMOS transistor Q9; a common terminal of the fifth resistor R5 and the ninth NMOS transistor Q9 serves as the second signal output terminal Outn of the input stage;

one end of the sixth resistor R6 is connected to the working power supply VDD, another end of the sixth resistor R6 is connected to the tenth NMOS transistor Q10; a common terminal of the sixth resistor R6 and the tenth NMOS transistor Q10 serves as the first signal output terminal Outp of the input stage;

one end of the seventh resistor R7 is connected to a gate of the ninth NMOS transistor Q9, another end of the seventh resistor R7 is connected to one end of the capacitor C1; a common terminal of the seventh resistor R7 and the ninth NMOS transistor Q9 serves as the first signal input terminal Inp of the input stage; a common terminal of the seventh resistor R7 and the capacitor C1 serves as the second DC compensation terminal DCinn of the input stage;

one end of the eighth resistor R8 is connected to a gate of the tenth NMOS transistor Q10, another end of the eighth resistor R8 is connected to another end of the capacitor C1; a common terminal of the eighth resistor R8 and the tenth NMOS transistor Q10 serves as the second signal input terminal Inn of the input stage; a common terminal of the eighth resistor R8 and the capacitor C1 serves as the first DC compensation terminal DCinp of the input stage;

an input terminal of the fourth constant current source I5 is connected to a source of the ninth NMOS transistor Q9 and a source of the tenth NMOS transistor Q10, an output terminal of the fourth constant current source I5 is grounded.

5. A DC offset cancellation method, based on the DC offset cancellation circuit as claimed in any one of claims 1, 2, 3 and 4, the DC offset cancellation method being applied to an application environment where the first signal input terminal Inp and the second signal input terminal Inn of the input stage do not input the input signals inn and inp, the DC offset cancellation method comprising:

step 1: the microprocessor presetting a decimal initial value and assigning the initial value to the digital control signal DCS; the digital-to-analog converter receiving the digital control signal DCS and generating the corresponding compensation signals dcinp and dcinn to be output to the input stage for compensation according to the digital control signal DCS;

step 2: using the two low-pass filters to extract the common-mode output signals G1 and G2 in the output signals outp and outn of the output buffer stage; the voltage comparator comparing the common-mode output signals G1 and G2 with each other to output the digital logic signal DLS; wherein when the common-mode output signal G1 is greater than the common-mode output signal G2, the digital logic signal DLS output from the voltage comparator being at a high level; when the common-mode output signal G1 is less than the common-mode output signal G2, the digital logic signal DLS output from the voltage comparator is at a low level;

step 3: the microprocessor reading the digital logic signal DLS generated by the voltage comparator and judging the digital logic signal DLS, if the digital logic signal DLS is at the high level, going to step 4; if the digital logic signal DLS is at the low level, going to step 5;

step 4: the microprocessor adding one to the initial value and assigning the processed initial value to the digital control signal DCS, and the digital-to-analog converter generating the corresponding compensation signals dcinp and dcinn to be output to the input stage for compensation according to the digital control signal DCS, and then repeating step 2, the microprocessor reading the digital logic signal DLS of the voltage comparator again and making a judgement, if the digital logic signal DLS is at the low level, the microprocessor keeping an assignment of the digital control signal DCS unchanged, otherwise repeating step 4;

step 5: the microprocessor subtracting one from the initial value and assigning the processed initial value to the digital control signal DCS, and the digital-to-analog converter generating the corresponding compensation signals dcinp and dcinn to be output to the input stage for compensation according to the digital control signal DCS, and then repeating step 2, the microprocessor reading the digital logic signal DLS of the voltage comparator again and making a judgement, if the digital logic signal DLS is at the high level, the microprocessor keeping the assignment of the digital control signal DCS unchanged, otherwise repeating step 5.

* * * * *